United States Patent [19]

Gross

[11] 4,088,924

[45] May 9, 1978

[54] DELAY LINE FOR TRAVELLING-WAVE TUBES

[75] Inventor: Franz Gross, Munich, Germany

[73] Assignee: Siemens Aktiengesellschaft, Berlin & Munich, Germany

[21] Appl. No.: 749,417

[22] Filed: Dec. 10, 1976

[30] Foreign Application Priority Data

Dec. 18, 1975 Germany ............................ 2557154

[51] Int. Cl.[2] ........................ H01J 25/36; H03H 7/30

[52] U.S. Cl. .................................... 315/3.5; 333/31A

[58] Field of Search ........................... 333/31 A, 31 R; 315/3.5

[56] References Cited

U.S. PATENT DOCUMENTS

| | | | |
|---|---|---|---|
| 3,471,738 | 10/1969 | Bert | 315/3.5 |
| 3,876,902 | 4/1975 | Gross | 315/3.5 |
| 3,924,151 | 12/1975 | Gross | 315/3.5 |

*Primary Examiner*—Alfred E. Smith
*Assistant Examiner*—Charles F. Roberts
*Attorney, Agent, or Firm*—Hill, Gross, Simpson, Van Santen, Steadman, Chiara & Simpson

[57] ABSTRACT

A delay line for travelling-wave tubes, comprising a hollow guide with successive transversely disposed discs having elongated attenuation members which project into the interior of the hollow wave guide, with the longitudinal axes of such attenuation members extending at least approximately parallel to the longitudinal axis of the delay line and mechanically firmly supported in recesses in the transverse discs. The attenuation members are retained by a press or force fit with the transverse discs, and may be provided in the portion thereof surrounded by the associated transverse disc with at least one notch which extends transversely to the longitudinal axes of the members and which is at least partially filled with the ductile material of such associated transverse disc.

4 Claims, 1 Drawing Figure

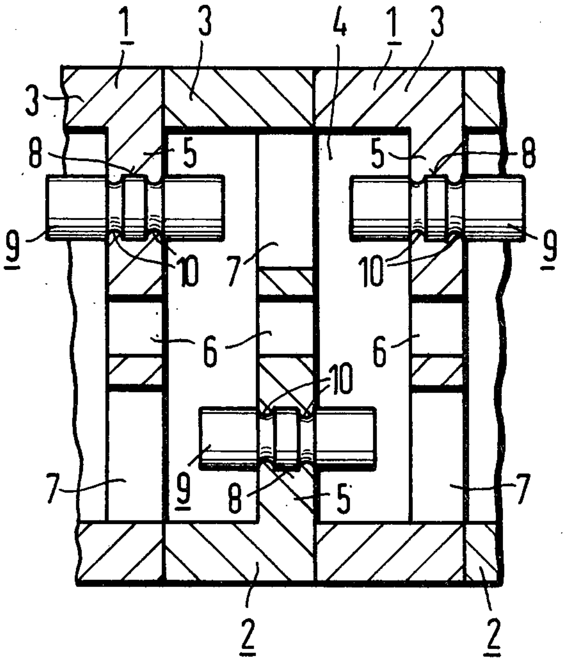
1
3
4
1
3
3
8
5
5
8
9
9
10
7
10
6
6
6
10
7
7
9
8
5
2
2

DELAY LINE FOR TRAVELLING-WAVE TUBES

BACKGROUND OF THE INVENTION

The invention relates to a delay line for travelling-wave tubes, comprising a hollow guide provided with successive transverse discs formed from a ductile material, which discs have at least one central opening for the passage of the electron beam and provided with respective attenuation members which extend into the hollow guide interior and have their longitudinal axes extending at least approximately parallel to the longitudinal axes of the delay line. The respective attenuation members are each mechanically rigidly mounted in a cooperable recess formed in the associated transverse disc. The invention also relates to a method for producing a delay line of this type.

A delay structure of the general type referred to is known from German Pat. No. 23 47 209, corresponding to U.S. Pat. No. 3,924,151, with the construction therein disclosed utilizing cylindrical attenuation members which are soldered into the transverse walls, each of which is additionally provided with a coupling opening or slot therein. While attenuation cylinders secured by a soldering operation are rigidly mounted in the desired operative positions, as has become apparent, completely exact reproducible attenuation values cannot be achieved as the solder spreads out during the soldering operation, in particular, on the metallized areas of the attenuation cylinder involved, and thus operatively loads the individual cells to an extent that is not completely controllable.

SUMMARY OF THE INVENTION

In accordance with the invention, to eliminate such problem in a delay line of the type initially described, the attenuation members are supported in the cooperable transverse discs by a press or force fit, and each member is provided in the portion thereof surrounded by the adjacent portion of the associated transverse disc, with at least one notch which extends transversely to the longitudinal axis of the member and which is at least partially filled with the ductile material of the associated transverse disc. As a general rule, transverse discs of delay lines, of the type involved, are constructed of copper or of an alloy utilizing a copper base, and the cooperable attentuation members are cylindrically formed.

To insure the flow of ductile material into the notch of the attenuation member, preferably the attenuation member, which has previously been formed with the desired notch, is initially inserted, i.e. pushed, into the recess of the corresponding transverse disc. The latter is thereafter compressed in axial direction in an annular area which is substantially concentrically disposed relative to the axis of the associated attenuation member and thus surrounds the same. As a result of such simple compression operation the outer diameter and wall thickness of the transverse disc remains substantially unaffected. With such a force fit, providing a direct interlocking of the attenuation member with the associated disc, the attenuation members are reliably and very efficiently mounted without the use of additional bonding materials or the like which would have an influencing effect on the tube characteristics. In addition, irrespective of different coefficients of thermo expansion between the copper disc and a ceramic attenuation bodies, the latter cannot become loose even with large temperature fluctuations. Further, the heat, due to energy losses, which is normally developed in the attenuation elements, is relatively effectively dissipated. The advantages of an attachment of an attenuation member in accordance with the present invention is of particular importance in connection with relatively thinwall discs which present, to the attenuation member, contact surfaces of only slight width, i.e. in the direction of the thickness of the disc.

While the use of a mere press fit between an attenuation cylinder, carried by a transverse vane disposed between two cell-forming transverse walls is known, copending application with U.S. Ser. No. 693,840, filing date June 8, 1976, same inventor such concept merely involves a pressed insertion of the cylinder into a bore, i.e. as a result of an interference fit.

Advantageously, the attenuation members, in accordance with the preferred embodiment of the invention, have the notch portion thereof extending, in the axial direction of the member, a distance equal to approximately one-half the corresponding thickness dimension of the associated disc.

It is particularly favorable to provide each of the attenuation members with two, axially spaced, annular grooves, their respective edges of which closest to the corresponding ends of the attenuation member being spaced apart a distance equal to the corresponding thickness of the associated disc, whereby such edges are substantially flush with the annular portions of the disc faces encircling the associated member. In this construction relatively low pressures are sufficient to effect a sufficient material flow to fill up the respective grooves as the transverse disc, when pressure is applied from opposite sides thereof, is deformed to the greatest extent at opposite faces adjacent the edges at the notched portions of the attenuation member. Tests have revealed that even with extremely thin copper discs, whose wall thickness is considerably less than the diameter of the attentuation cylinders inserted therein, a rigid cylinder mounting existed even after repeated heating up of the structure.

BRIEF DESCRIPTION OF THE DRAWING

The invention will be more specifically explained in connection with the preferred illustrative embodiment disclosed in the drawing, in which the single FIGURE merely represents a longitudinal sectional view of a portion of a delay line, sufficient for an adequate explanation of the invention.

DETAILED DESCRIPTION

Referring to the drawing, there is illustrated therein a fragmentary portion of a delay line, merely three transverse discs thereof being illustrated, with the travelling-wave tube involved being adapted for the amplification of millimeter waves. The delay line thus comprises a plurality of aligned discs 1 and 2, constructed, for example, of copper and disposed in alignment one behind the other, in the direction of the electron beam, with the discs being assembled in a stacked arrangement to form a unitary structure. Each disc is provided with a peripheral annular flange or wall 3, the outer end edges of which abut the adjacent disc, whereby each disc functions as a transverse wall 5 operative to define successive cells.

Each of the transverse walls 5 is provided with a central opening 6 for the passage of the electron beam, as well as a coupling opening 7 which is radially disposed with respect to the central opening, with each successive line disc being rotated about its axis through 180°, whereby corresponding alternate and intermediate discs have the coupling openings thereof extending in aligned relation. Each pair thus constitutes a period of the delay line, with the line so formed having a backward-running fundamental wave in the longest wave length band, and it is thus operated in the first forward running space harmonic, i.e., between the pi and 2 pi points.

Each of the transverse walls 5 is provided with a recess 8 therein, with each recess being disposed in opposed relation to the adjacent coupling openings 7. In the construction illustrated, each recess comprises a bore extending completely through the associated wall, with a cooperable cylindrically shaped attenuation member, i.e. attenuation cylinder 9 extending therethrough and thus projecting at opposite sides of the associated wall. Such attenuation cylinders may, for example, be formed from tungsten, aluminum oxide, berillium oxide or aluminum oxide.

Each attenuation cylinder is illustrated as being provided with two spaced annular shaped grooves 10 therein which are positioned in the portion of the member encircled by the transverse wall 5. If will be noted that the axially outermost edges of each cooperable pair of grooves are axially spaced a distance equal to the corresponding thickness of the wall 5 whereby such edges terminate approximately flush with the opposite faces of the transverse wall.

Installation of the respective attentuation members is achieved in the following manner. A cylinder is initially inserted into the corresponding recess of a wall 5, following which such wall is disposed between tubular pistons or rams which extend over the projecting ends of the attenuation body and engage the transverse wall adjacent such attenuation member. Upon the application of pressure, the transverse wall is thereby placed under compression, whereby the ductile material thereof will flow into the respective grooves of the attenuation member to provide a rigid interlocking engagement of the wall with the attenuation member.

Further details with respect to the construction and manufacture of such a delay line, as well as with respect to the selection of the material therefore, may be found in the previously referred to patent.

It will be appreciated that the invention is not limited to the specific delay line construction illustrated. For example, it is immaterial whether the attenuation members are supported by transversely extending cell-defining walls or transverse vanes disposed therebetween. Likewise, the invention is equally applicable to the mounting of attenuation members which are inset into bottomed recesses as distinguished from the bores illustrated which extend completely through the supporting walls. However, it will be appreciated that bores, such as illustrated in this drawing, have the advantage that a single attenuation member can be employed for simultaneously attenuating two adjacent cells, and in addition, the two adjacent cells can be provided with arbitrarily different attenuation loading, utilizing merely a single attenuation member.

It will further be noted that the invention enables a free selection of materials for the attenuation member and the delay line, requiring merely that the transverse discs can be sufficiently deformable under its application of pressure, to create the desired material flow into the grooves of the attenuation member. In addition to copper, alloys such as berillium-copper, for example, can be employed for the disc structures.

Having thus described my invention it will be obvious that although various minor modifications might be suggested by those versed in the art, it should be understood that I wish to embody within the scope of the patent granted hereon all such modifications as reasonably, and properly come within the scope of my contribution to the art.

I claim as my invention:

1. A delay line for travelling-wave tubes, comprising a hollow guide provided with successive transverse discs of a ductile material, each of which has at least one central opening for the passage of the electron beam, and supports an elongated attenuation member which projects into the hollow guide interior, with the longitudinal axes of the respective attenuation members extending at least approximately parallel to the longitudinal axis of the delay line and rigidly mechanically mounted in respective recesses formed in the associated transverse disc, each attenuation member being secured in the associated disc by an interlocking pressed fit, with the portion of such member encircled by the associated disc having at least one notch which extends transversely to the longitudinal axis of the member, and which notch is at least partially filled with the ductile material of the associated disc.

2. A delay line according to claim 1, wherein the notched portion of the respective attenuation members extends, in axial direction, for approximately half the thickness of the disc thereat.

3. A delay line according to claim 1, wherein each attenuation member is provided with a pair of spaced notches, each in the form of an annular groove, both of which are disposed within the recess of the associated disc.

4. A delay line according to claim 1, wherein each attenuation member is provided with a pair of spaced notches, each in the form of an annular groove, and said recess in the associated disc is in the form of a bore extending therethrough, the respective outer edges of such grooves, in each case terminating flush with the respective adjacent outer surfaces of the disc thereat.

* * * * *